(12) United States Patent
Huang

(10) Patent No.: US 6,259,291 B1
(45) Date of Patent: Jul. 10, 2001

(54) SELF-ADJUSTING APPARATUS AND A SELF-ADJUSTING METHOD FOR ADJUSTING AN INTERNAL OSCILLATING CLOCK SIGNAL BY USING SAME

(75) Inventor: Cheng-Wang Huang, Chupei (TW)

(73) Assignee: Integrated Technology Express, Inc., Hsinchu (TW)

( * ) Notice: Subject to any disclaimer, the term of this patent is extended or adjusted under 35 U.S.C. 154(b) by 0 days.

(21) Appl. No.: 09/251,607

(22) Filed: Feb. 17, 1999

(30) Foreign Application Priority Data

Nov. 27, 1998 (TW) ................................... 87119704

(51) Int. Cl.[7] ........................................................ H03L 7/00
(52) U.S. Cl. ...................... 327/160; 327/298; 327/115; 377/16
(58) Field of Search ................................. 327/113, 115, 327/117, 160, 291, 298, 299; 377/47, 16

(56) References Cited

U.S. PATENT DOCUMENTS 3,725,794 * 4/1973 Asplund ................................. 377/47
4,686,386 * 8/1987 Tadao ................................... 327/143
5,719,510 * 2/1998 Weidner ............................... 327/119

* cited by examiner

Primary Examiner—Toan Tran
Assistant Examiner—Cassandra Cox
(74) Attorney, Agent, or Firm—Knobbe, Martens, Olson & Bear, LLP

(57) ABSTRACT

A self-adjusting apparatus including a clock generator built within an IC generates an adjusted internal oscillating clock signal by referring to an external target signal while the IC is running in a normal mode, and a method for adjusting the internal oscillating clock signal of an IC by using the apparatus. While an IC is operating in a normal mode, which is a more power-consuming mode, the apparatus adjusts the internal oscillating clock signal of the IC by referring to the frequency of an external clock signal generated by an external clock generator. When the IC is forced to run in a power-down mode, which consumes less power, the self-adjusting apparatus is still able to provide a precise internal oscillating clock signal required for operating the electronic circuit without the presence of an external clock signal.

11 Claims, 2 Drawing Sheets

SELF-ADJUSTING APPARATUS AND A SELF-ADJUSTING METHOD FOR ADJUSTING AN INTERNAL OSCILLATING CLOCK SIGNAL BY USING SAME

CROSS-REFERENCE TO RELATED APPLICATION

This application claims the priority benefit of Taiwan application Ser. No. 87119704, filed Nov. 27, 1998, the full disclosure of which is incorporated herein by reference.

BACKGROUND OF THE INVENTION

1. Field of the Invention

This invention relates to an apparatus and a method for adjusting clock signals, and more particularly, to a self-adjusting apparatus and a self-adjusting method for adjusting an internal oscillating clock signal by using the self-adjusting apparatus.

2. Description of Related Art

A clock generator is normally included in the design of an electronic circuit for generating clock signals to control the sequence of signal and data processing and to synchronize different signals in order to prevent the occurrence of malfunction caused by disordered signal processing sequence. In most electronic circuits, the clock signal generated by a clock generator is often used as a trigger for activating a process and resetting a process. In some situations, the clock signals also serve as a reference signal.

According to the current designing demand, a clock generator has become a required component of an electronic circuit that includes integrated circuits (ICs), so that the ICs can operate in various power-consuming modes, such as normal mode and power-down mode, depending on the actual needs for energy-saving purposes. Conventionally, a clock generator includes a crystal and an oscillator. It is designed to be external to an IC, and to be connected to the IC by an electronic circuit. However, since the power supply to the clock generator is independent from that to the IC, the power distribution of the electronic circuit becomes more complicated. Furthermore, the power supply to the clock generator alone has become a drain of system power even while the IC is running in a power-down mode.

Another conventional design of an electronic circuit including an IC and a clock generator forms the clock generator inside the IC in order to make the device more energy-conservative. The built-in clock generator is normally formed by implementing a logic device fabrication process into the fabrication process of the IC. However, the clock generator made with a logic device fabrication process alone can hardly provide a very precise internal clock signal; therefore, some extra processes are required to ensure that the clock signal generating frequency is acceptable. In addition, the clock generator is non-adjustable once it is made. As a result, the IC is useless if the built-in clock generator cannot generate a clock signal in a precise frequency.

In view of the foregoing, there is a need for a self-adjusting apparatus and method that is able to adjust the internal oscillating clock signal while the device is running in a normal mode accordingly to an external clock signal.

SUMMARY OF THE INVENTION

The invention provides a self-adjusting apparatus including an internal clock generator built into an integrated circuit (IC), and a method for adjusting the internal clock signal of the IC by using the self-adjusting apparatus to ensure that the IC operates properly in a power-down mode and reduce the power consumption.

In accordance with the foregoing, the invention provides a self-adjusting apparatus including a clock generator built within an IC to generate an adjusted internal oscillating clock signal by referring to an external target signal while the electronic circuit is running in a normal mode. The invention also provides a method for adjusting the internal clock signal of an IC.

While an IC is operating in a normal mode, which consumes more power, the apparatus adjusts the internal oscillating clock signal of the IC by referring to the frequency of an external clock signal generated by an external clock generator. As soon as the IC is forced to run in a power-down mode, which consumes less power, the self-adjusting apparatus is still able to provide a precise internal clock signal required for operating the electronic circuit without the presence of an external clock signal.

The self-adjusting method of the invention adjusts the internal clock signal generated by an internal clock generator built in an IC included in an electronic circuit. The electronic circuit also contains a clock generator external to the IC for generating an external clock signal and a subcircuit for generating a desired external divisor signal. While the electronic circuit is running in a normal mode, the external clock signal is first divided by the external divisor signal for out putting a first target clock signal, which is the external target clock signal. Since the external clock signal and the external divisor signal are normally more precise and reliable, the first target clock signal, which normally can be obtained by using a divider, is then used as a reference signal for stabilizing and adjusting the internal clock signal. By using a counter to count the number of periods of the internal clock signal occurring within one period of the external target clock signal, an internal divisor signal is obtained. Then, the internal clock signal is divided by the internal divisor signal for obtaining a second target signal, which is the internal target signal. The frequencies of the first target clock signal and the second target clock signal are the same. Therefore, as soon as the IC is forced to run in a power-down mode, the operation of the IC can still operate properly by using the second target clock signal as a stable and reliable reference signal.

The invention provides a self-adjusting apparatus for adjusting an internal clock signal to generate an internal target clock signal by referring to a provided external clock signal and a provided divisor signal while the IC is running in a normal mode. The internal oscillating clock signal is then employed in the absence of the external clock signal when the IC is running in a power-down mode. The self-adjusting apparatus of the invention contains a clock generator, a first clock divider, a counter and a second clock divider. The first clock divider receives both the external clock signal and the external divisor signal, and outputs an external target clock signal by dividing the external clock signal by the external divisor. The external target clock signal is then into the counter. In the meantime, an internal clock signal generated by the clock generator is also fed into the counter. The counter generates an internal divisor signal by counting the number of periods of the internal clock signal occurring within one period of the external target clock signal. The internal divisor signal is subsequently sent to the second clock divider. The second clock divider also receives the internal clock signal from the clock generator of the self-adjusting apparatus. By dividing the internal clock signal with the internal divisor signal, the second clock divider then output the internal target clock signal, which is an adjusted internal clock signal. Because the internal target clock signal is actually obtained by referring to the external clock signal and the external divisor signal, the frequency of the internal target clock signal is equal to the frequency of the external target clock signal. Hence, the frequency of the internal oscillating clock signal is adjusted, and can be used by the IC in the absence of the external clock signal.

The invention also provides another self-adjusting apparatus for adjusting the internal clock signal of an IC. The self-adjusting apparatus is capable of generating an adjusted internal oscillating clock signal, an internal target clock signal, by referring to a provided external clock signal and a provided external divisor signal. The self-adjusting apparatus contains a clock generator, a first clock divider, a counter, a second clock divider and a buffer. The first clock divider receives an external clock signal and an external divisor signal, and outputs an external target clock signal by dividing the external clock signal with the external divisor signal. The external target clock signal is fed into the counter. In the meantime, an internal clock signal generated by the clock generator is also fed into the counter. The counter obtains an internal divisor signal by counting the number of periods of the internal clock signal occurring within one period of the external target clock signal, and outputs the internal divisor signal to the buffer. The clock generator generates an internal clock signal and feeds the internal clock signal to the counter and the second clock divider. The buffer buffers the internal divisor signal and outputs it to the second clock divider. The second clock divider divides the internal clock signal by the internal divisor signal for obtaining an internal target clock signal. Because the internal target clock signal is actually obtained by referring to the external clock signal and the external divisor signal, the frequency of the internal target clock signal, which is the adjusted internal clock signal, is equal to the frequency of the external target clock signal. Hence, the internal clock signal is adjusted. Since the buffer is capable of storing the internal divisor signal obtained while the IC is running in a normal mode, it can still provide the internal divisor signal required for generating a precise internal clock signal even while the IC is running in a power-down mode.

These and other features and advantages of the invention will become apparent upon reading the following detailed description and studying the various figures of the drawings.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The invention provides a method for adjusting an internal clock signal of a integrated circuit (IC) by referring to a provided external clock signal while the IC is running in a normal mode. The adjusted internal clock signal is able to provide the IC with a more precise reference signal to ensure the operation of the IC in the absence of the external clock signal when the IC is running in a power-down mode.

Normally, a divider is utilized to drop the frequency of a clock signal to meet the actual need, which is the frequency of a target clock signal. That is, clock signals with different frequencies can be converted into identical target signals by dividing them with proportional divisors. By applying the foregoing theory, the invention provides a method and an apparatus for obtaining a precise internal clock signal equal to an external target clock signal, which is equal to the result of dividing an external clock signal by an external divisor signal. In detail, the method and the apparatus of the invention obtain an adjusted internal clock signal by dividing an internal clock signal with an internal divisor signal determined by referring to the external target clock signal and the internal clock signal.

Figure 1:
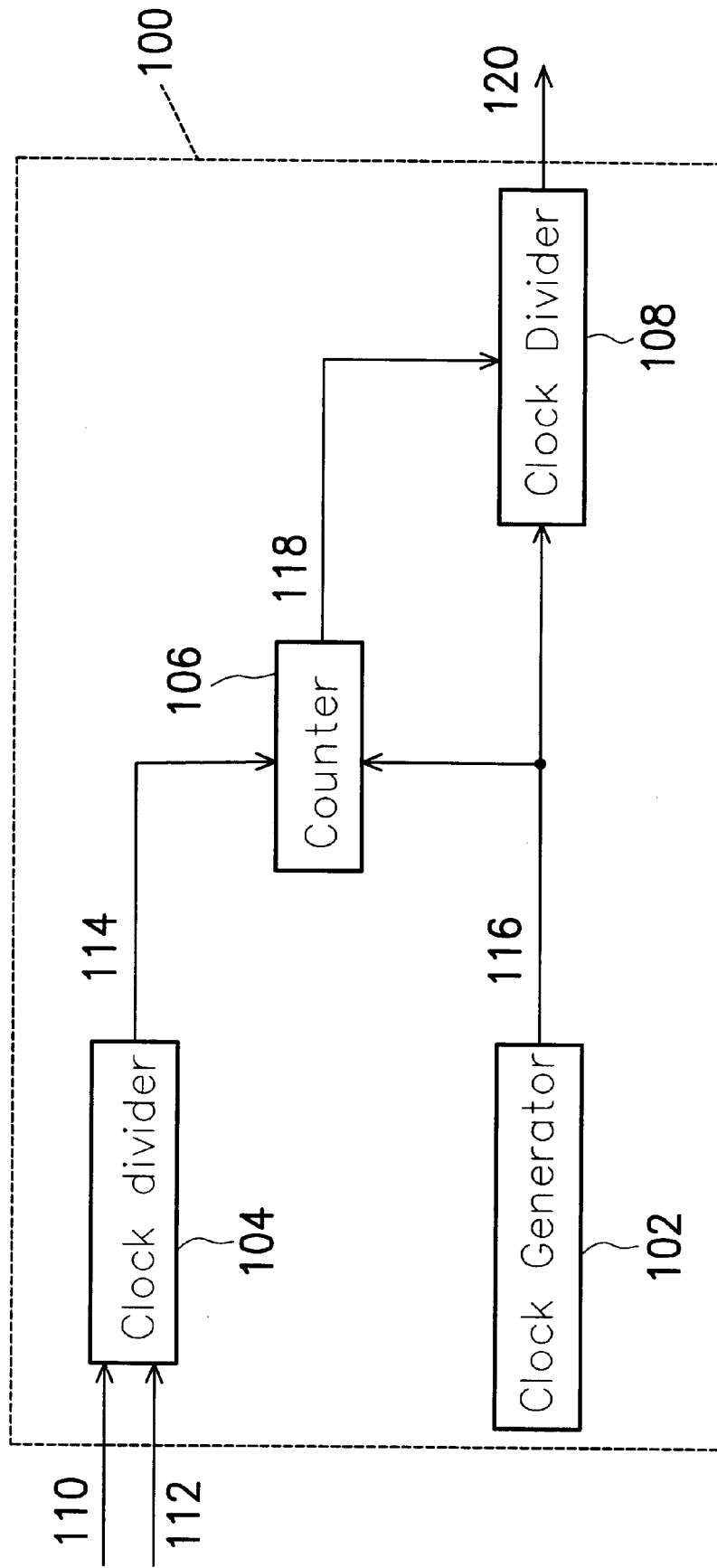
FIG. 1 is a schematic block diagram showing a self-adjusting apparatus of a preferred embodiment according to the invention.

FIG. 1 is a schematic block diagram showing the self-adjusting apparatus 100 of a preferred embodiment according to the invention.

Referring to FIG. 1, the self-adjusting apparatus 100 generates an internal target signal 120 by referring to a provided external clock signal 110 and a provided external divisor signal 112. The self-adjusting apparatus 100 is composed of a clock generator 102, clock dividers 104 and 108, and a counter 106. The clock generator 102 can be an oscillating circuit for generating an internal clock signal 116, wherein the internal clock signal 116 is fed into the counter 106 and clock divider 108. The other clock divider 104 receives the external clock signal 110 and the external divisor signal 112, and then outputs an external target signal 114 to the counter 106. The external target signal 114 is obtained by using the external divisor signal 112 to divide the external clock signal 110. One of the aspects of the invention is to generate an internal clock signal that has a frequency identical to that of the external target clock signal.

The external target clock signal is then fed into the counter 106. The counter obtains an internal divisor signal 118, which is the number of valid periods of the internal clock signal 116 occurring within one period of the external target clock signal 114. The internal divisor signal 118 is fed into the clock divider 108. There are various methods for pursuing the internal divisor signal 118. For example, it can be done by counting the number of valid periods of the internal clock signal 116 occurring within one period of the external target clock signal 114. Or, alternatively, it can be done by counting the number of valid periods of the internal clock signal 116 occurring within a certain number of periods of the external target clock signal 114, and balancing the counted number by the number of the periods of the external target clock signal.

The divider 108 then processes the received internal clock signal 116 and the internal divisor signal 118 to obtain the desired, adjusted internal clock signal 120, wherein the process can be dividing the internal clock signal 116 by the internal divisor signal 118.

The method of the invention is more understood through the following mathematical derivation.

Assuming the external clock signal 110 is carried by a frequency $F_{ext}$, the internal clock signal 116 is carried by a frequency $F_{in}$, the internal and external target clock signals are both carried by a frequency $F_f$, the external divisor signal is carried by a frequency $D_{ext}$, and the internal divisor signal is carried by a frequency Din, then according to the foregoing description, an equation below is set to be true:

$$F_f = F^{ext}/D^{ext} = F_{in}/D_{in}.$$

That is, the frequency $F_f$ of the internal target clock signal 120 is equal to the quotient resulting from division of the frequency $F_{in}$ of the internal clock signal 116 by the frequency $D_{in}$, of the internal divisor signal 118. Additionally, the frequency $F_f$ of the internal target signal 120 is also set to be equal to the frequency of the external target clock signal 114, which is the quotient resulting from division of the frequency $F_{ext}$ of the external clock signal 110 by the frequency $D_{ext}$ of the external divisor signal 112. Therefore, the method of the invention can then use the apparatus of the invention to generate a precise internal target clock 120 signal by referring to an external clock signal 10 and an external divisor signal 112.

In addition, the counter 106 further functions with a property of latching, so that the counter 106 is capable of storing the obtained internal divisor signal 118, and provides the clock divider 108 with the stored internal divisor signal 118 for generating the internal oscillating signal 120 even in the absence of the external clock signal 110 during the power-down mode.

Referring again to FIG. 1, the method of the invention first obtains an external target clock signal 114 by dividing the external clock signal 110 by the external divisor signal 112. Then, the external target clock signal 114 together by the internal clock signal 116 are processed in order to determine the internal divisor signal 118. The frequency of the internal divisor signal 118 is found by counting the number of valid periods of the internal clock signal 116 occurring within one period of the external target clock signal 114. By dividing the internal clock signal 116 with the determined internal divisor signal 118, a desired internal target signal 120 is obtained.

Figure 2:
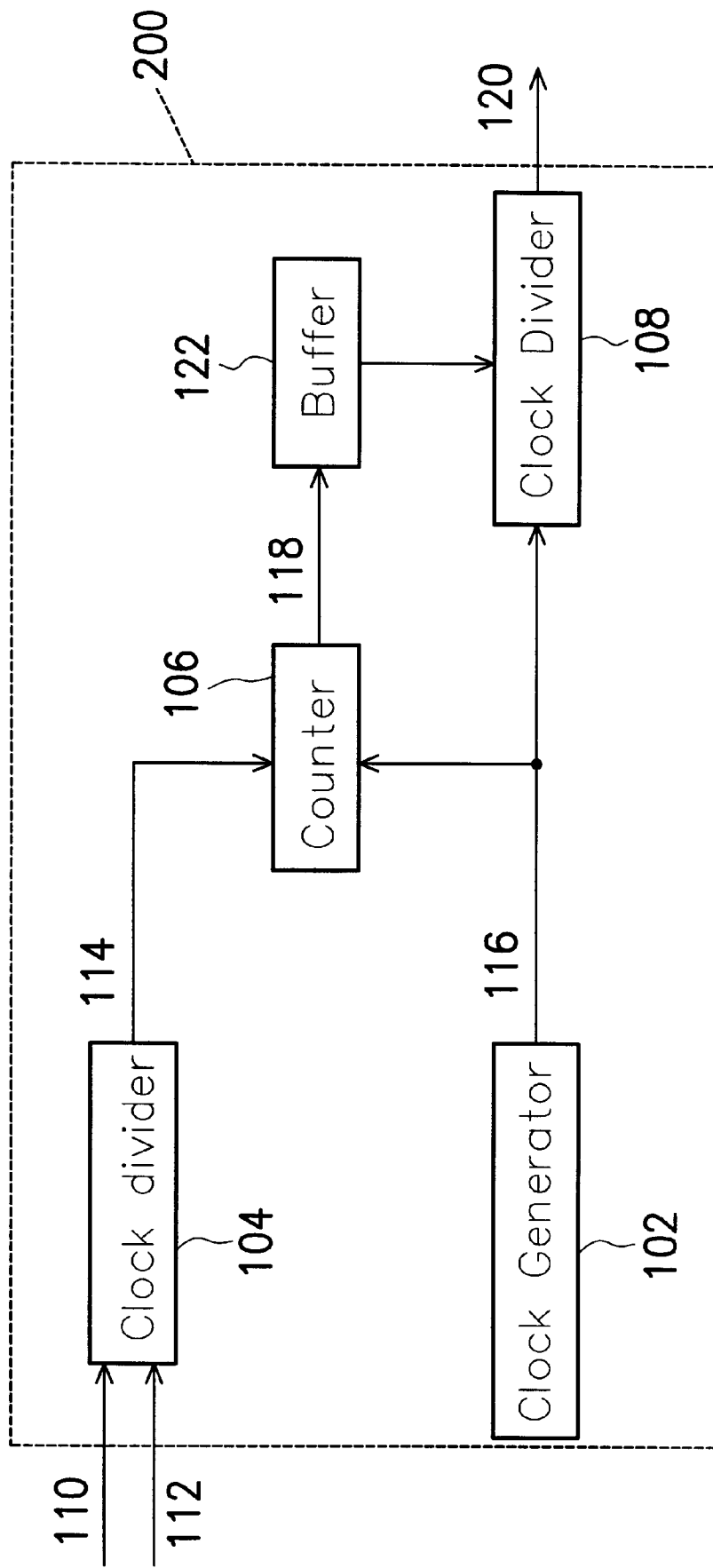
FIG. 2 is a schematic block diagram showing a self-adjusting apparatus of another preferred embodiment according to the invention.

A self-adjusting apparatus of another preferred embodiment according to the invention is also provided for generating a precise internal clock signal, as shown in FIG. 2.

Referring next to FIG. 2, the self-adjusting apparatus 200 of the second preferred embodiment of the invention is also capable of generating an internal target signal 120 by referring to a provided external clock signal 110 and a provided external divisor signal 112. The self-adjusting apparatus 200 contains a clock generator 102, two clock dividers 104 and 108, a counter 106, and a buffer 122. The clock generator 102 can be an oscillating circuit for generating an internal clock signal 116, wherein the internal clock signal 116 is fed into the counter 106 and clock divider 108. The other clock divider 104 receives the external clock signal 110 and the external divisor signal 112, and then outputs an external target signal 114 to the counter 106. The external target signal 114 is obtained by using the external divisor signal 112 to divide the external clock signal 110. One of the aspects of the invention is the generation of an internal clock signal that has a frequency identical to that of the external target clock signal.

The external target clock signal is then fed into the counter 106. The counter obtains an internal divisor signal 118, which is the number of valid periods of the internal clock signal 116 occurring within one period of the external target clock signal 114. The internal divisor signal 118 is fed into the buffer 122.

There are various methods for pursuing the internal divisor signal 118. For example, it can be done by counting the number of valid periods of the internal clock signal 116 occurring within one period of the external target clock signal 114. Or, alternatively, it can be done by counting the number of valid periods of the internal clock signal 116 occurring within a certain number of periods of the external target clock signal 114, and balancing the counted number by the number of the periods of the external target clock signal.

The buffer 122 stores the internal divisor signal 118 and subsequently feeds the internal divisor signal 118 to the clock divider 108. Because the buffer 122 is capable of storing the internal divisor signal 118, it can still provide the required internal divisor signal 118 even in the absence of the external clock signal when the IC is operating in a power-down mode.

The divider 108 then processes the received internal clock signal 116 and the internal divisor signal 118 for obtaining the desired, adjusted internal clock signal 120, wherein the process can be dividing the internal clock signal 116 by the internal divisor signal 118.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A self-adjusting method for adjusting an internal clock signal of an integrated circuit (IC) by using an external clock signal, wherein the internal clock signal is generated in the IC and is used as a reference clock signal, and wherein the IC is able to operate in modes including a normal mode and a power-down mode, the improvement comprising:

adjusting the internal clock signal for outputting an adjusted internal clock signal by using the external clock signal while the IC is running in the normal mode, and providing the IC with the adjusted internal clock signal in the absence of the external clock signal while the IC is running in the power-down mode.

2. A self-adjusting method for adjusting an internal clock signal, wherein the internal clock signal in generated in an integrated circuit (IC), and the IC is provided with an external clock signal and an external divisor signal, the method comprising steps of:

using the external divisor signal to divide the external clock signal for outputting a first target signal;

counting the number of periods of the internal clock signal occurring within one period of the first target signal, wherein the number is an internal divisor signal; and using the internal divisor signal to divide the internal clock signal in order to obtain a second target signal.

3. A self-adjusting apparatus for adjusting an internal clock signal by using an external clock signal and an external divisor signal to generate an internal target clock signal, the self-adjusting apparatus comprising:

a clock generator for generating the internal clock signal;

a first clock divider using the external divisor signal to divide the external clock signal for generating an external target signal;

a counter for counting the number of periods of the internal clock signal occurring within one period of the external target signal, wherein the number is an internal divisor signal; and a second clock divider using the internal divisor signal to divide the internal clock signal for generating the internal target signal.

4. A self-adjusting apparatus for adjusting an internal clock signal by using an external clock signal and an external divisor signal to generate an internal target clock signal, the self-adjusting apparatus comprising:

a clock generator for generating the internal clock signal;

a first clock divider using the external divisor signal to divide the external clock signal for generating an external target signal;

a counter for counting number of periods of the internal clock signal occurring within one period of the external target signal, wherein the number is an internal divisor signal;

a buffer for storing and outputting the internal divisor signal; and a second clock divider using the internal divisor signal to divide the internal clock signal for generating the internal target signal.

5. An apparatus for generating an output clock signal, the apparatus comprising:

internal clock generator module for generating an internal clock signal having an internal frequency;

a counter module for receiving a) a target clock signal having a target frequency and b) the internal clock signal, the counter module generating an internal divisor signal indicative of an internal divisor value, wherein the internal divisor value is approximately equal to the ratio of the internal frequency over the target frequency; and a divider module receiving the internal divisor signal from the counter module and the internal clock signal from the internal clock generator, the divider module generating the output clock signal having an output frequency, wherein the output frequency is approximately equal to the ratio of the internal frequency over the internal divisor value, thereby ensuring that the output frequency is approximately equal to the target frequency.

6. The apparatus of claim 5, wherein the counter module comprises a memory for storing the internal divisor value so as to enable the apparatus to continue generating the output clock signal in the event that the first divider module no longer receives the input clock signal.

7. The apparatus of claim 5, further comprising a buffer for storing the internal divisor value so as to enable the apparatus to continue generating the output clock signal in the event that the first divider module no longer receives the input clock signal.

8. A method of generating an output clock signal having an output frequency approximately equal to a target frequency, the method comprising:

receiving an input clock signal having an input frequency;

receiving an external divisor signal indicative of an external divisor value;

generating a target clock signal having the target frequency, wherein the target frequency is approximately equal to the input frequency divided by the external divisor value;

generating an internal clock signal having an internal frequency;

generating an internal divisor signal indicative of an internal divisor value, wherein the internal divisor value is approximately equal to the internal frequency divided by the target frequency; and combining the internal clock signal with the internal divisor signal to generate the output clock signal such that the output frequency is approximately equal to the ratio of the internal frequency over the internal divisor value.

9. A method of generating an output clock signal having an output frequency, the method comprising:

providing a target clock signal having a target frequency;

generating an internal clock signal having an internal frequency;

determining a divisor value approximately equal to the number of internal clock signal cycles occurring within one period of the target clock signal;

dividing down the internal clock signal using the divisor value so as to generate the output clock signal, wherein the output frequency is substantially equal to the target frequency; and storing the divisor value so as to enable continued generation of the output clock signal when the target clock signal is no longer provided.

10. The method of claim 9, wherein providing a target clock signal comprises:

receiving an input clock signal having an input frequency;

receiving an input divisor signal indicative of an input divisor value; and dividing down the input clock signal using the input divisor value.

11. A self-adjusting method for adjusting an internal clock signal of an integrated circuit (IC) by using an external clock signal, wherein the internal clock signal is generated in the IC and is used as a reference clock signal, and wherein the IC is able to operate in modes including a normal mode and power-own mode, the improvement comprising:

adjusting the internal clock signal in a variable manner for outputting an adjusted internal clock signal by using the external clock signal while the IC is running in the normal mode, and providing the IC with the adjusted internal clock signal in the absence of the external clock signal while the IC is running in the power-down mode.

* * * * *

UNITED STATES PATENT AND TRADEMARK OFFICE
CERTIFICATE OF CORRECTION

PATENT NO.    : 6,259,291 B1
DATED         : July 10, 2001
INVENTOR(S)   : Cheng-Wang Huang It is certified that error appears in the above-identified patent and that said Letters Patent is hereby corrected as shown below:

Column 8,
Line 43, "power-own" should be -- power-down --.

Signed and Sealed this

Fourth Day of June, 2002

Attest:

Attesting Officer

JAMES E. ROGAN
Director of the United States Patent and Trademark Office